(12) United States Patent
Cheng et al.

(10) Patent No.: US 7,599,212 B2
(45) Date of Patent: Oct. 6, 2009

(54) METHOD AND APPARATUS FOR HIGH-EFFICIENCY OPERATION OF A DYNAMIC RANDOM ACCESS MEMORY

(75) Inventors: Hank Cheng, Taichung (TW); Chen-Hui Hsieh, Chu-Pei (TW); Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 68 days.

(21) Appl. No.: 11/625,572

(22) Filed: Jan. 22, 2007

(65) Prior Publication Data

US 2008/0175037 A1    Jul. 24, 2008

(51) Int. Cl.
*G11C 11/24* (2006.01)
(52) U.S. Cl. ............... 365/149; 365/205; 365/203
(58) Field of Classification Search ............... 365/149, 365/205, 203, 202
See application file for complete search history.

(56) References Cited

U.S. PATENT DOCUMENTS

| | | | |
|---|---|---|---|
| 5,042,011 A | 8/1991 | Casper et al. | |
| 5,280,205 A | 1/1994 | Green et al. | |
| 5,627,785 A | 5/1997 | Gilliam et al. | |
| 6,608,794 B2 * | 8/2003 | Yoshioka | 365/230.03 |
| 2003/0174533 A1 * | 9/2003 | Ito | 365/149 |

* cited by examiner

*Primary Examiner*—Huan Hoang
(74) *Attorney, Agent, or Firm*—Duane Morris LLP

(57) ABSTRACT

The disclosure generally relates to a method and apparatus for reading and writing information to a memory cell in communication with a word line and one of a bit line or a complementary bit line. A method according to one embodiment includes: equalizing the bit line and the complementary bit line to a common voltage; addressing the memory cell by connecting the memory cell to one of the bit line or the complementary bit line; reading the memory cell by detecting a first charge stored in the memory cell and communicated said first charge to one of the bit line or the complementary bit line; and writing a second charge into the memory cell by communicating the second charge to the memory cell through an inverter and one of the bit line or the complementary bit line. In one embodiment, the inverter is activated only to communicate the second charge to the memory cell.

21 Claims, 5 Drawing Sheets

METHOD AND APPARATUS FOR HIGH-EFFICIENCY OPERATION OF A DYNAMIC RANDOM ACCESS MEMORY

The disclosure relates to memory circuits. More specifically, the disclosure relates to a dynamic random access memory (DRAM) circuit and method for high-efficiency operation thereof.

BACKGROUND

Conventional DRAMs provide a random access to the memory circuit by storing each bit of data in a separate memory cell. Each memory cell includes a capacitor connected to an access transistor. The capacitor holds a charge representative of a data bit while the transistor accesses the capacitor during the reading and writing operations. A DRAM circuit includes an array of individual memory cells arranged in rows and columns. Each row of memory cells communicates with a word line and each column of memory cells communicates with one of a bit line or a complementary bit line. Data is transmitted to and from each memory cell through the bit line and the complementary bit line.

The data is typically accessed through the cell address which identifies a memory cell by its row and column in the array. To address a memory cell in the array, the memory circuit identifies the memory cell located at an intersection between the identified row and column. To read or write (store) information to a memory cell, it must first be selected or addressed. Addressing a memory cell is accomplished by inputting signals to a row detector and a column detector. The row detector activates a word line responsive to the row address, and the selected word line in turn activates the access transistors for all memory cells in communication with the word line. Similarly, the column decoder identifies a pair of bit line and complementary bit line in response to the column address. Thus, when reading a cell, the selected word line activates the access transistor for a row address and data is latched to the bit line and the complementary bit line in communication with the desired cell.

As stated, the capacitor in a memory cell stores a charge which represents the logical state of the memory. A logical state of 1 represents a charge stored on the capacitor and a discharged capacitor has a logical state of 0. The bit line and the complementary bit line communicate the charge of the capacitor to a sense amplifier which senses small charge differentials on the bit line pair. The sense amplifier also connects the bit line pairs to power supply rails for reading the memory cell or writing onto the cell.

Conventional sense amplifiers use a back-to-back inverter by cross-coupling a pair of pull down transistors and a pair of pull-up transistors. Among others, the back-to-back inverter drives the appropriate charge to the bit line pair in order to conduct the refreshing and the writing operations. If the memory cell contains a charge different from the charge that is to be written, the inverter will oppose or fight the sensing operation, thereby delaying the writing operation and consuming additional power.

SUMMARY OF THE DISCLOSURE

In one embodiment, the disclosure relates to a method for reading and writing information to a memory cell in communication with a word line and one of a bit line or a complementary bit line, the method comprising: equalizing the bit line and the complementary bit line to a common voltage; addressing the memory cell by connecting the memory cell to one of the bit line or the complementary bit line; reading the memory cell by detecting a first charge stored in the memory cell and communicated said first charge to one of the bit line or the complementary bit line; and writing a second charge into the memory cell by communicating the second charge to the memory cell through an inverter and one of the bit line or the complementary bit line. In one embodiment, step of writing a second charge further includes: engaging the inverter to communicate with the memory cell; communicating the second charge to the memory cell through the inverter; and disengaging the inverter from the memory cell.

In another embodiment, the disclosure relates to a data storage memory circuit comprising: a memory row having a plurality of memory cells, each memory cell connected to a word line and to one of a bit line or a complementary bit line, a column selector for selectively identifying one of the plurality of memory cells for a reading operation and a writing operation; a sensor for detecting a first charge stored in said memory cell during a reading operation; an inverter circuit for driving the voltage of the bit line and the complementary bit line; and a controller for selectively activating the inverter to write a second charge into the memory cell by driving one of the bit line or the complementary bit line to a voltage commensurate with the second charge.

In another embodiment, the disclosure relates to a sense amplifier circuit for use with a memory device comprising: an equalizer for driving a bit line and a complementary bit line to a common voltage; a memory cell in communication with one of the bit line or the complementary bit line and operable to drive one of the bit line or the complementary bit line to a first voltage; a column selector for selectively connecting each of the bit line and the complementary bit line to a voltage source, the voltage source providing a second voltage; an inverter circuit for coupling the memory cell to one of the bit line or the complementary bit line when writing the second voltage to the memory cell; and a controller for engaging the inverter to write the second voltage to the memory cell and disengaging the inverter after the memory cell is charged with the second voltage.

DETAILED DESCRIPTION

Figure 1:
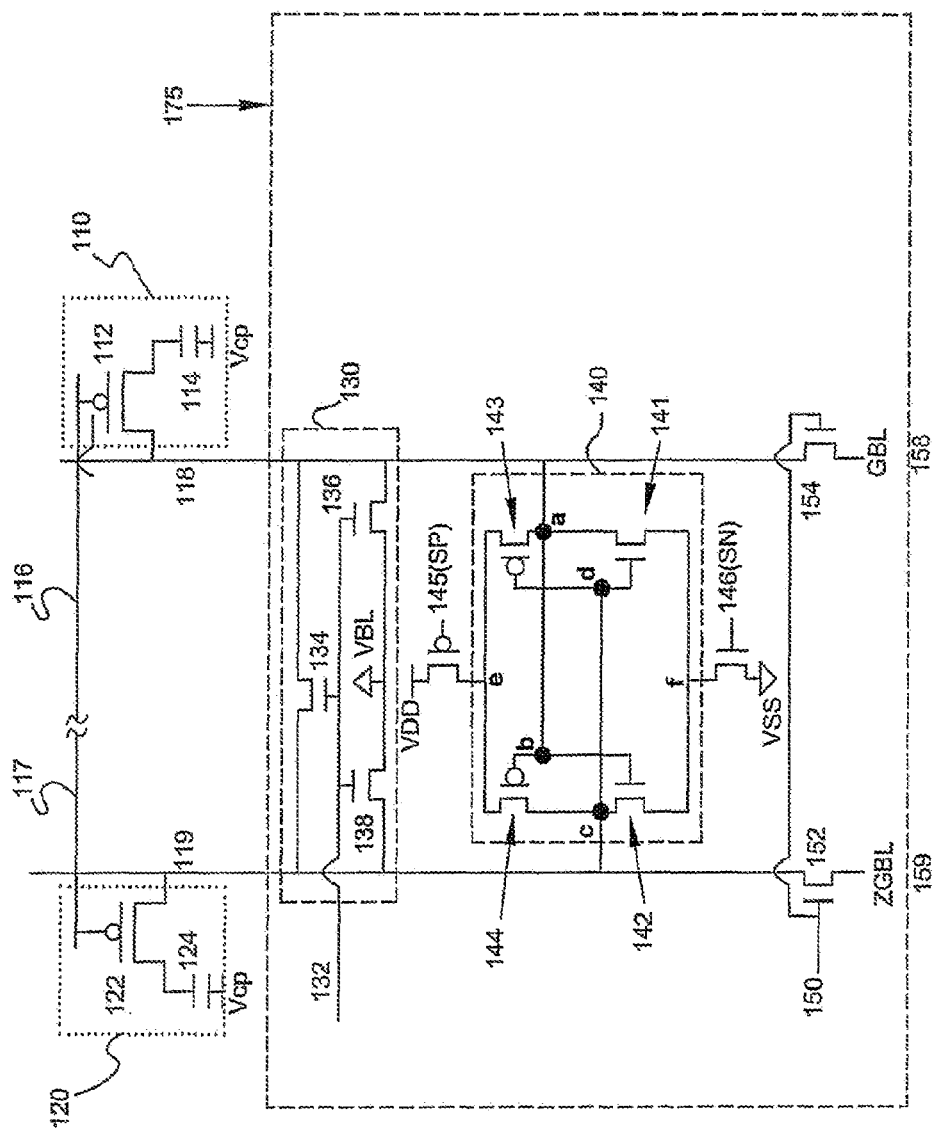
FIG. 1 is a schematic illustration of a conventional memory cell and a sense amplifier.

FIG. 1 is a schematic illustration of a conventional memory cell and a sense amplifier. In FIG. 1, memory cell 110 comprises PMOS transistor 112 and capacitor 114. The gate of transistor 112 is connected to word line (WL) 116. The drain of transistor 112 is connected to bit line (BL) 118. A second memory cell 120 is positioned opposite memory cell 110. Memory cell 120 comprises PMOS transistor 122 connected to WL 117 and complementary bit line (ZBL) 119. The transistors 112 and 122 form the transistors in the DRAM array. Each of the transistors 112 or 122 can be an NMOS or a PMOS transistor.

Each of the BL 118 and ZBL 119, respectively, can connect to a global BL 158 and global ZGBL 159 through column selector 150. Column selector 150 can comprise transistor switches 152 and 154 to selectively connect and disconnect the BL 118 and ZBL 119 in order to advance the reading and writing operations.

In FIG. 1, an exemplary sense amplifier 175 is shown to include pre-charge equalization circuit 130 and back-to-back inverter 140. The pre-charge circuit 130 includes transistors 134, 136 and 138. Transistors 134, 136 and 138 can be NMOS transistors. The pre-charge circuit 130 can optionally couple to each of the BL 118 and ZBL 119 to provide pre-charging equalization between these lines.

Inverter 140 comprises transistors 141, 142, 143 and 144. Inverter 140 can be, for example, a back-to-back inverter or a cross-coupled CMOS inverter. Transistors 141 and 142 can be NMOS transistors while transistors 143 and 144 can be PMOS transistors. As shown, the gates of transistors 141 and 143 can be connected to the source electrodes of transistors 142 and 144 as well as to ZBL 119. Similarly, gates of transistors 142 and 144 can be connected to the drain electrodes of transistors 141 and 143 as well as to BL 118. Transistor switches 145 and 146 control inverter 140. In one embodiment of the disclosure, transistor switch 145 can be a PMOS transistor and transistor switch 146 can be an NMOS transistor.

Operation of an inverter 140 within a conventional sense amplifier 175 will now be described with reference to FIG. 1 and an exemplary state where memory cell 110 has a logical charge of 1. After the equalizing step, BL 118 connects to drain electrodes of transistors 141 and 143 at node (a) and gate electrodes of transistors 142 and 144 at node (b). Similarly, ZBL 119 connects to drain electrodes of transistors 142 and 144 at node (c) and gate electrodes of transistors 141 and 143 at node (d). The source electrodes of transistors 143 and 144 are coupled to switch 145 (SP) at node (e) and the source electrodes of transistors 141 and 142 are coupled to switch 146 (SN) at node (f).

During the developing period, WL 116 engages memory cell 110. Since transistor 112 is engaged, charges stored in capacitor 114 flow into BL 118, resulting in the slight increase in the voltage of BL 118. BL is coupled to drain electrodes of transistors 141 and 143 at node (a) and to gate electrodes of transistors 142 and 144 at node (b); and ZBL is coupled to drain electrodes of transistors 142 and 144 at node (c) and to gate electrodes of transistors 141 and 143 at node (d). Source electrodes of transistors 143 and 144 (node (e)) are coupled to switch 145(SP), and source electrodes of 141 and 142 are coupled to switch 146(SN).

During the sensing period, switch 146 (SN) is high and switch 145(SP) is low. In other words, VDD is coupled to node (e) and the source electrodes of transistors 143 and 144, while VSS is coupled to node (d) and the source electrodes of transistors 141 and 142. In this period, the slightly-increased voltage on BL 118 is applied to node (b), which results in turning on transistor 142 slightly. Since transistor 142 is slightly on, the voltage at node (c) is coupled to VSS and is pulled down. The voltage at node (c) is also applied to node (d) (i.e., the gate electrodes of transistors 141 and 143), which results in turning on transistor 143 slightly. Since transistor 143 is on and its source electrode at node (e) is coupled to VDD, the voltage at node (a) connects to VDD and is pulled up. In turn, the voltage at node (a) is applied to node (b) and enhances turning on transistor 142 and coupling VSS to node (Q). Under this cycling reaction, the voltage at node (a) (i.e., the voltage of BL 118) is quickly pulled up and the voltage at node (c) (i.e., the voltage of ZBL 119) is quickly pulled down. The situation is generally referred to "full swing" and will be further discussed in relation to FIG. 2.

In an exemplary writing operation, the pre-charge equalization circuit 132 is engaged to pre-charge BL 118 and ZBL 119 to the voltage same voltage (i.e., $V_{BL}$). Next, the memory cell 110 is addressed by turning on WL 116. To select a particular memory cell (i.e., cell 112 or 122) one of BL 118 or ZBL 119 and one of WL 116 or WL 117 can be selected to sense data stored in a corresponding memory. Once BL 118 is connected to capacitor 114, BL 118 will develop substantially the same charge as the capacitor. This stage shall be referred to as the developing stage. The back-to-back inverter 140 is then engaged by turning on switches 145 and 146. Once developed the charge of capacitor 114 can be determined by sensing the voltage difference between BL 118 and ZBL 119. Finally, column selector 150 is used to connect one of BL 118 or ZBL 119 to a voltage source for writing data to memory cells 110 or 120.

A problem arises during the sensing and writing operations when the memory cell contains a charge opposite to the charge which is to be written. During the sensing period, switch 146 is switched low (off) and switch 145 is switched to high (on). That is, transistors 143 and 144 are coupled to VDD and transistors 141 and 142 are coupled to VSS. Consequently, inverter 140 functions to pull-up voltage of BL 118 ($V_{BL}$). If the cell's logical state is 1 the operation of the inverter 140 will oppose the change to logical state 0. This situation is further illustrated with simultaneous reference to FIGS. 1 and 2.

Figure 2:
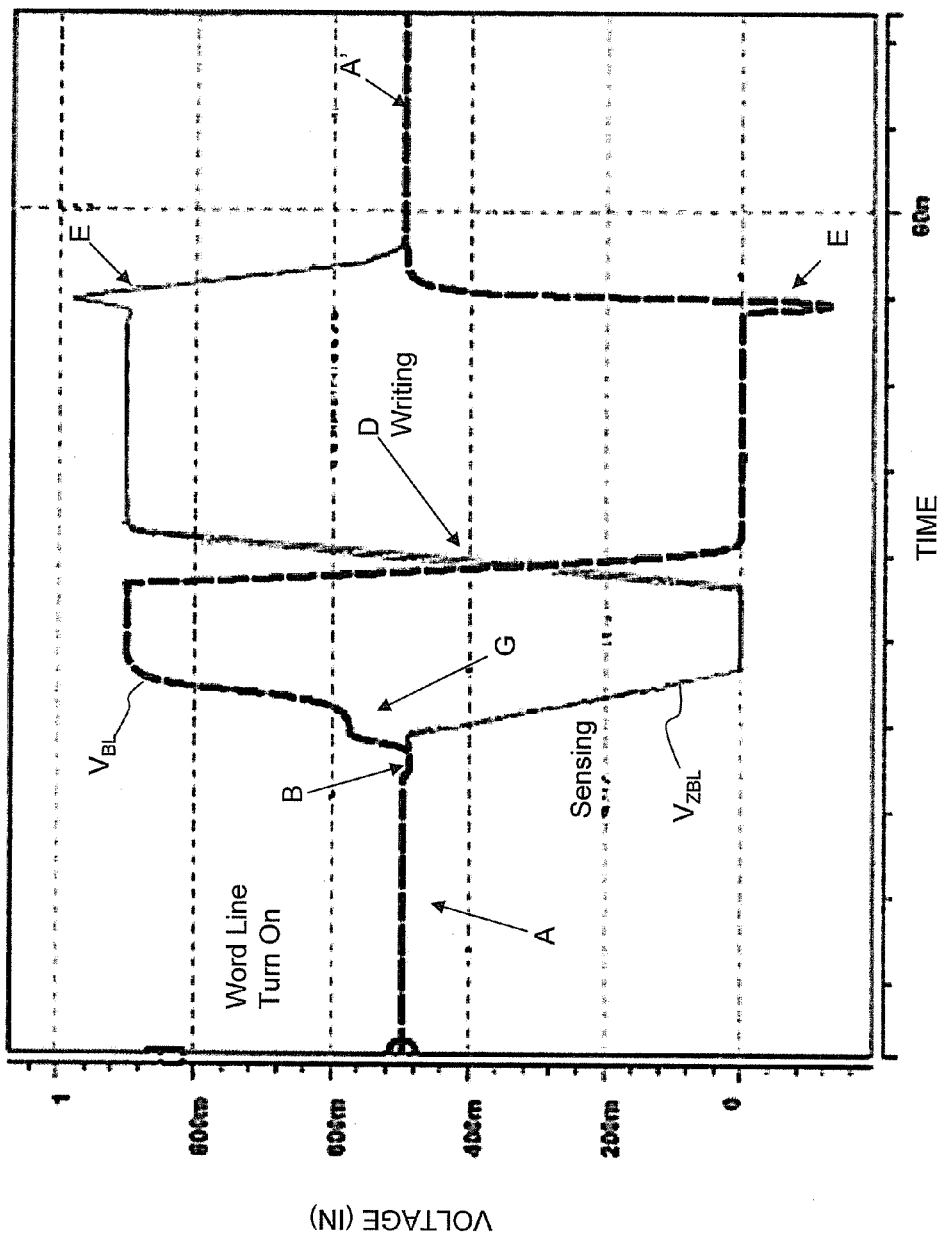
FIG. 2 shows voltage change occurring in a conventional memory system during a read/write cycle.

FIG. 2 shows voltage change occurring in a conventional memory system during a read/write cycle. A conventional read/write cycle includes equalizing BL 118 and ZBL 119, developing capacitor's 114 charge in BL 118, sensing the charge in BL 118 as compared with ZBL 119 and writing new data into memory cell 110.

The first step in the process is equalizing the charge in BL 118 and ZBL 119. This is shown in FIG. 2 as period A where pre-charging equalizer 132 of FIG. 1 connects BL 118 and ZBL 119 with each other thereby equalizing the charge to about 0.55 v. At this time, conventional sense amplifiers disengages pre-charge equalizer 132 and engages inverter 140. It should be noted that charge equalization voltage can be in the range of about 0 V to 0.5 or 0 V to VDD.

To sense the logical state of memory cell 110, WL 116 is coupled to transistor 112 connecting capacitor 114 to BL 118. Assuming that memory cell 110 has logical state 1, a charge will flow from capacitor 114 to BL 118. This period, showing development of charge in BL 118, is identified as region B in FIG. 2. Because inverter 140 is engaged, it will pull up $V_{BL}$ while simultaneously pulling down $V_{ZBL}$. As shown in FIG. 2, this will cause the $V_{BL}$ curve to spike while the $V_{ZBL}$ curve dips. This delays the writing operation and increases power consumption.

To write an opposite logical state (i.e., a low charge) into memory cell 110, the sense amplifier 175 must override the existing charge. In this example where the memory cell 110 has a logical state of 1, writing a logical state of zero would require discharging capacitor 114. At this time column selector 150 engages so that GBL 158 applies voltage to BL 118 and ZGBL 159 applies voltage to GBL 119. The writing operation is shown as between points D and A' in FIG. 2. The status of various parts of a conventional memory system during a read/write cycle is tabulated below at Table 1:

TABLE 1

Read/Write operation of a conventional memory system.

|  | Equalize | Develop | Sensing | Writing | Equalize |
|---|---|---|---|---|---|
| Switch 146 | L | L | H | H | L |
| Switch 145 | H | H | L | L | H |
| Inverter 140 | Off | Off | On | On | Off |
| WL 116 | Off | On | On | On | Off |

To overcome these and other deficiencies according to one embodiment of the disclosure, the inverter 140 can be disengaged during the sensing operation and engaged only during the writing operation. In one embodiment, disengaging inverter 140 during the sensing operation van be done with existing circuitry without modifying the circuit. In an alternative embodiment, the circuit can include a controller for engaging the inverter 140 during the writing operation.

Figure 3:
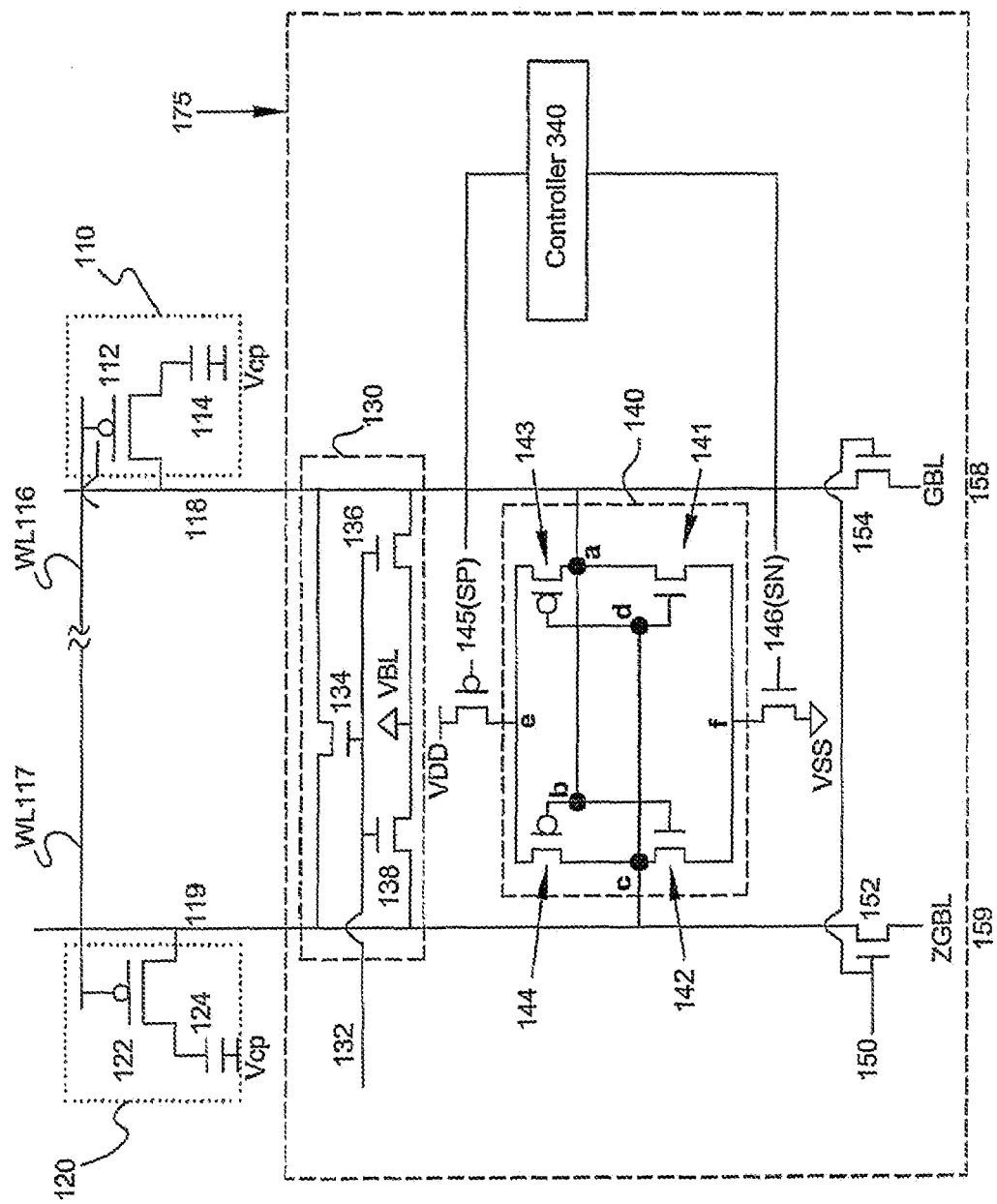
FIG. 3 is an exemplary storage memory circuit according to one embodiment of the disclosure.

FIG. 3 is an exemplary storage memory circuit according to one embodiment of the disclosure. In FIG. 3, memory cells 110 and 120 are connected to word lines 116 and 117, respectively. Memory cells 110 and 120 are also connected, respectively, to bit line 118 and complementary bit line 119. Sense amplifier 175 includes, among others, pre-charge circuit 130, back-to-back inverter 140 and controller 340. Although the exemplary storage memory circuit of FIG. 3 shows controller 340 as a part of sense amplifier 175, it should be noted that the disclosure is not limited thereto and controller 340 can be independent of sense amplifier 175. Controller 340 can comprise a switch or a switching circuit, a microprocessor controlled by appropriate software (i.e., firmware) or any other mechanism for selectively engaging/disengaging inverter 140.

Controller 340 can engage or disengages back-to-back inverter 140 by controlling one or both of switches 145(SP) and 146 (SN). In an alternative embodiment (not shown), controller 340 can engage/disengage back-to-back inverter 140 by controlling signal communication from bit line 118 and/or complementary bit line 119 to inverter 140 in addition to, or instead of, controlling switches 145(SP) and 146(SN).

Controller 340 can be configured to engage back-to-back inverter 140 during certain operations according to the disclosed embodiments. For example, controller 340 can disengage back-to-back inverter 140 during the sensing operation and engage back-to-back inverter 140 dining the writing operation. Controller 340 can maintain the back-to-back inverter 140 disengaged after completion of the writing operation.

Figure 4:
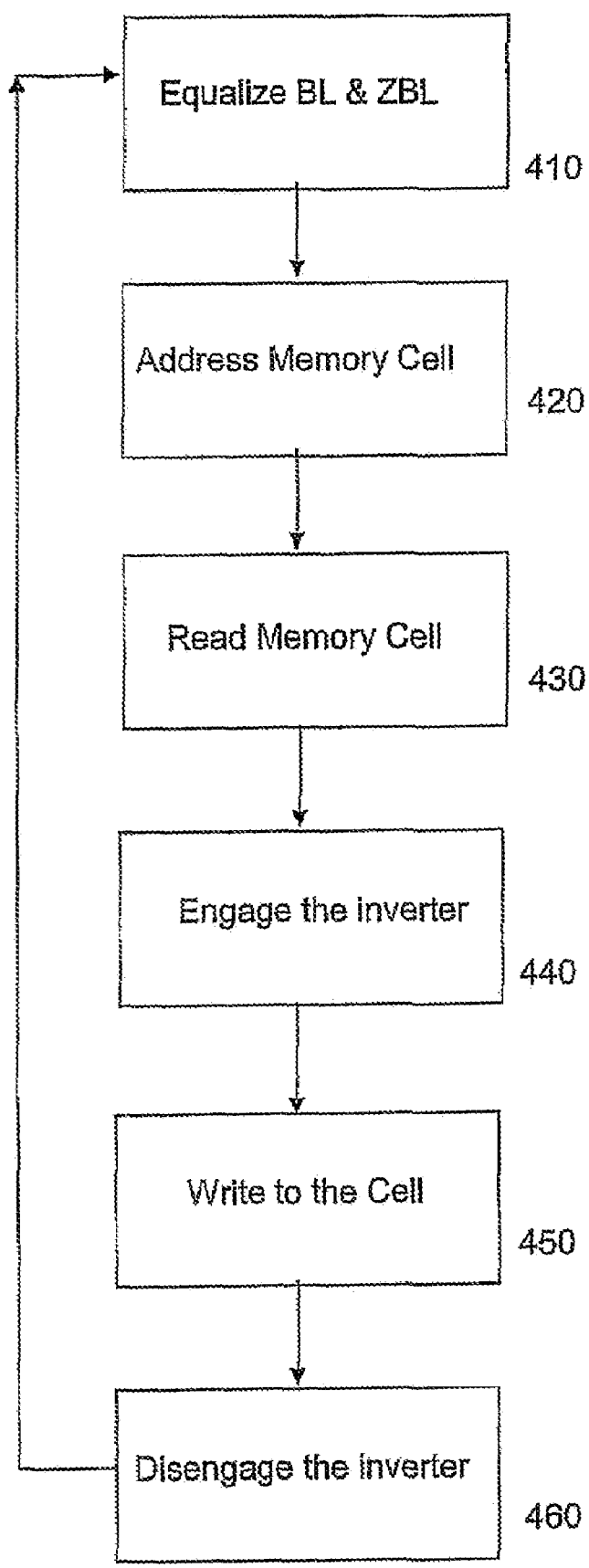
FIG. 4 is an exemplary method according to one embodiment of the disclosure.

FIG. 4 is an exemplary method according to one embodiment of the disclosure. Referring to the process shown in FIG. 4, in step 410, the bit line and the complementary bit line are equalized to a common voltage. In step 420, the memory cell is addressed by connecting the memory cell to one of the bit line or the complementary bit line. In step 430, the memory cell is read by detecting a first charge stored in the memory cell and communicated the stored charge to one of the bit line or the complementary bit line. In step 440 the writing process is initiated by first activating the inverter and then writing a second charge into the memory cell by communicating the second charge to the memory cell through the inverter (step 450). According to one embodiment, once the writing operation is complete, the inverter is disengaged in step 460. The process can be repeated as needed during the read/write cycle.

Figure 5:
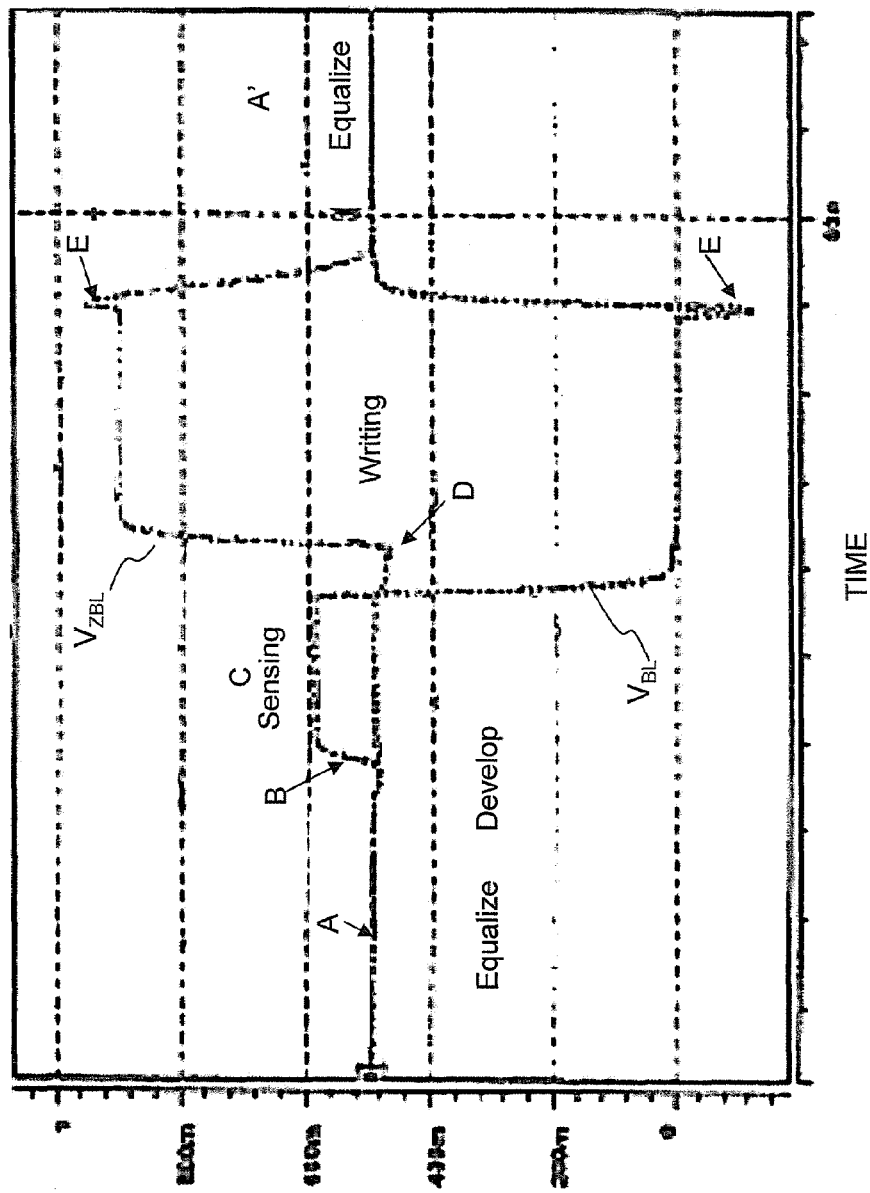
FIG. 5 shows voltage change in a memory system according to one embodiment of the disclosure during the read/write cycle.

An exemplary operation of the exemplary embodiment of the disclosure is provided with simultaneous reference to FIGS. 3 and 5. FIG. 5 shows voltage change in a memory system according to one embodiment of the disclosure. In FIG. 5, the equalization step A is implemented by connecting BL 118 and ZBL 119 via pre-charge equalizer 132. Thereafter, the equalizer 132 is disengaged. Controller 340 also disengages back-to-back 140 by disengaging one or both of switches 145(SP) and 146(SN). Next, WL 116 can connect capacitor 114 with BL 118. A charge disparity between capacitor 114 and BL 118 causes a flow of charge during the development period B. It should be noted that since pre-charging equalizer 132 is disengaged, only $V_{BL}$ develops a charge while $V_{ZBL}$ remains substantially constant.

The writing operation follows at point D. At this stage, column selector 150 and inverter 140 can be selectively engaged to connect BL 118 and ZBL 119 to GBL 158 and ZGBL 159, respectively. Controller 340 can also engage the back-to-back inverter 140 at the same time or thereabout. Once charged, BL 118 can write an appropriate charge or logical state to capacitor 114 of memory cell 110. The end of the writing operation is shown at FIG. 4 as points E. At the end of the writing operation, back-to-back inverter 140 is once again disengaged by controller 340 and the equalization process is started as shown by A'. Table 2 summarizes the operation of a memory system according to one embodiment of the disclosure during a read/write cycle:

TABLE 2

Operation of a memory system during a read/write cycle.

|  | Equalize | Develop | Sensing | Writing | Equalize |
|---|---|---|---|---|---|
| Switch 146 | L | L | L | H | L |
| Switch 145 | H | H | H | L | H |
| Inverter 140 | Off | Off | Off | On | Off |
| WL 116 | Off | On | On | On | Off |

A comparison between FIG. 2 and FIG. 4 reveals the advantages of a method according to one embodiment of the disclosure. For examples the voltage difference between the $V_{BL}$ and $V_{ZBL}$ curves during the sensing period (i.e. between points B and D) is substantially smaller in FIG. 4 than in FIG. 2. The diminished area between the curves indicates that, among others, much less energy is used during the sensing stage and that the writing process is not impeded.

The embodiments disclosed herein are exemplary in nature and are used to illustrate the principles disclosed herein. The scope of the principles disclosed herein are not limited to these exemplary embodiments.

What is claimed is:

1. A method for reading and writing information to a memory cell in communication with a word line and one of a bit line or a complementary bit line, the method comprising:

equalizing the bit line and the complementary bit line to a common voltage while an inverter of a sense amplifier is disengaged;

addressing the memory cell by connecting the memory cell to one of the bit line or the complementary bit line;

reading the memory cell by detecting a first charge stored in the memory cell and communicating said first charge to one of the bit line or the complementary bit line while the inverter of the sense amplifier remains disengaged; and engaging the inverter of the sense amplifier while writing a second charge into the memory cell by communicating the second charge to the memory cell through the inverter of the sense amplifier and one of the bit line or the complementary bit line.

2. The method of claim 1, wherein the step of addressing the memory cell further comprises directing the word line coupled to the memory cell to enable communication between the memory cell and one of the bit line or the complementary bit line.

3. The method of claim 1, wherein the step of reading the memory cell further comprises sensing the first charge communicated to one of the bit line or the complementary bit line.

4. The method of claim 3, wherein the common voltage is in the range of about 0.5 to 0.55 volts or in the range of about 0 to 0.5 volts.

5. The method of claim 1, wherein the inverter comprises a back-to-back inverter.

6. The method of claim 1, wherein the inverter is a flip-flop.

7. The method of claim 1, wherein the step of reading the memory cell further comprises directing the first charge to a detection circuit.

8. A data storage memory circuit comprising:
   a memory row having a plurality of memory cells, each memory cell connected to a word line and to one of a bit line or a complementary bit line,
   a column selector for selectively identifying one of the plurality of memory cells for a reading operation and a writing operation; and
   a sense amplifier for amplifying a charge to be stored in said memory cell during a writing operation, the sense amplifier including:
      an inverter circuit configured to pull up and pull down voltages of the bit line and the complementary bit line when writing the charge to the memory cell; and
      a controller configured to engage the inverter only when the charge is being written to the memory cell and to disengage the inverter of the sense amplifier when not writing the charge to the memory cell.

9. The memory circuit of claim 8, wherein the sense amplifier further comprises a pre-charge equalizer circuit for driving the bit line and the complementary bit line to a common voltage.

10. The memory circuit of claim 8, wherein the sense amplifier further comprises a pre-charge equalizer circuit for driving the bit line and the complementary bit line to a common voltage prior to the reading operation.

11. The memory circuit of claim 8, wherein each memory cell comprises a capacitor and a transistor.

12. The memory circuit of claim 8, wherein the data storage is a dynamic random access (DRAM) memory system.

13. The memory circuit of claim 8, wherein the inverter is a flip-flop.

14. The memory circuit of claim 8, wherein the inverter is a back-to-back inverter.

15. The memory circuit of claim 8, wherein the inverter is a cross-coupled CMOS inverter.

16. A sense amplifier circuit for use with a memory device comprising:
   an equalizer for driving a bit line and a complementary bit line to a common voltage;
   an inverter circuit configured to pull up and pull down voltages of the bit line and the complementary bit line when writing a charge to a memory cell; and
   a controller configured to engage the inverter when writing the charge to the memory cell and to disengage the inverter when not writing the charge to the memory cell.

17. The sense amplifier circuit of claim 16, wherein the memory device defines a random access memory system.

18. The sense amplifier circuit of claim 16, wherein the inverter circuit is a flip-flop.

19. The sense amplifier circuit of claim 16, wherein the inverter circuit is a back- to-back inverter.

20. The sense amplifier circuit of claim 16, wherein the inverter circuit is a cross- coupled CMOS inverter.

21. The sense amplifier circuit of claim 16, wherein the memory cell comprises a capacitor communicating with a transistor.

* * * * *

UNITED STATES PATENT AND TRADEMARK OFFICE
CERTIFICATE OF CORRECTION

PATENT NO. : 7,599,212 B2  Page 1 of 1
APPLICATION NO. : 11/625572
DATED : October 6, 2009
INVENTOR(S) : Hank Cheng, Chen-Hui Hsieh and Chung-Cheng Chou It is certified that error appears in the above-identified patent and that said Letters Patent is hereby corrected as shown below:

Column 5, line 46, replace "dining" with -- during --.

Signed and Sealed this

Twenty-third Day of March, 2010

David J. Kappos
*Director of the United States Patent and Trademark Office*